United States Patent [19]

Tanase

[11] Patent Number: 5,414,352
[45] Date of Patent: May 9, 1995

[54] PARAMETRIC TEST CIRCUIT WITH PLURAL RANGE RESISTORS

[75] Inventor: Gabriel E. Tanase, Cupertino, Calif.

[73] Assignee: Raytheon Company, Lexington, Mass.

[21] Appl. No.: 9,497

[22] Filed: Jan. 26, 1993

[51] Int. Cl.⁶ ............................................ G01R 31/22
[52] U.S. Cl. ................................. 324/158.1; 324/73.1
[58] Field of Search .............. 324/158 R, 73.1, 158 D, 324/158 T, 115, 158.1, 765; 371/15.1, 22.5, 20.1, 22.6, 22.3; 437/8

[56] References Cited

U.S. PATENT DOCUMENTS

| | | | |
|---|---|---|---|
| 3,988,672 | 10/1976 | Cowart | 324/158 T |
| 4,044,244 | 8/1977 | Foreman et al. | 324/73 R |
| 4,583,223 | 4/1986 | Ioue et al. | 324/73.1 |
| 4,646,299 | 2/1987 | Schinabeck et al. | 324/73.1 |
| 4,739,252 | 4/1988 | Malaviya et al. | 324/158 D |
| 5,200,696 | 4/1993 | Menis et al. | 324/73.1 |

OTHER PUBLICATIONS

"Programmable Stimulus/Measurement Units Simplify Device Test Setups", Hewlett–Packard Journal, Oct. 1982.

Primary Examiner—Vinh Nguyen
Attorney, Agent, or Firm—William R. Clark

[57] ABSTRACT

A parametric test circuit adapted for testing a device in two alternate modes of operation. In one mode, the circuit forces a voltage on the device under test and measures the current drawn. In the alternate mode, the circuit forces voltage on the device under test and measures the voltage. The same circuit components including a difference amplifier are used in both modes of operation, and they are merely reconfigured by a plurality of switches. Further, a plurality of range resistor sections are used, and the nonselected sections are prevented from interfering with the selected section by zero-biasing anti-parallel diode pairs in series with the nonselected range resistors.

15 Claims, 3 Drawing Sheets

PARAMETRIC TEST CIRCUIT WITH PLURAL RANGE RESISTORS

BACKGROUND OF THE INVENTION

This invention generally relates to testing electronic devices, and more particularly relates to parametric testing of electronic devices such as integrated circuits.

As is well known, parametric test units are used to test electronic devices such as integrated circuits for parameters such as current and voltage. In particular, a "per-pin" parametric test unit is connected to a single pin or terminal of an electronic device. As an example, the pin of the device might be internally connected to an electrode of a transistor to be tested. Parametric test units have been used to force a predetermined voltage on a test device pin, and concurrently measure the current drawn by that pin. Alternatively, parametric test units have been used to force a predetermined current into a test device pin, and concurrently measure the voltage at the pin. These two functions or modes of testing have been descriptively referred to as force voltage/measure current and force current/measure voltage. Parametric measurements relating to voltage and current are correlated to provide important information regarding the quality of the device under test.

It has also been well known that while keeping the pin voltage in a predetermined range such as −5 volts to +15 volts, it is desirable to be able to maximize the current that is measured or forced into the device under test to optimize the accuracy of the parametric testing. Typically, the current is measured across or forced through a resistor, and a plurality of parallel connected range resistors have been used. In order to change from one range resistor having a predetermined precision resistance to another range resistor having a different predetermined precision resistance, corresponding relays have been placed in series with the resistors. In operation, only one relay is activated at a time, and its corresponding range resistor is selectively switched into the parametric test circuit.

SUMMARY OF THE INVENTION

In accordance with the invention, a circuit comprises a terminal adapted to be connected to a device under parametric test, an input voltage source, and a plurality of range resistor sections coupled in parallel between the input voltage source and the terminal wherein each of the sections comprises a range resistor and a corresponding switch and first diode connected in series. The circuit further includes range resistor selector means for closing the switch corresponding to a selected range resistor, and opening the switches and zero biasing the diodes corresponding to unselected range resistors. It is preferable that each range resistor section further comprises a second diode connected in parallel and opposite polarity with the first diode. Such arrangement is commonly referred to as an anti-parallel diode pair. The diode pair may also be part of a diode bridge that functions as the corresponding switch of the section. That is, when current is forced to flow into and out of the respective intermediate nodes of the diode bridge, the switch is closed, and when no current flows, the switch is open. It is also preferable that the circuit further comprises means comprising a difference amplifier having inputs responsive to a current drop across the selected range resistor for providing a voltage proportional to current drawn through the selected range resistor by the device. The voltage providing means may further comprise a pair of buffer amplifiers connected as voltage followers and having respective positive inputs coupled to opposite sides of the selected range resistor, and outputs coupled to the difference amplifier. Also, the zero biasing means may comprise means for coupling an output of one of the buffer amplifiers to sides of the diode pairs opposite the corresponding unselected range resistors.

With such arrangement, the zero biasing of the diode pairs prevents current from flowing through the unselected range resistors and interfering with the accuracy of measurement of current through the selected range resistor. Thus, solid state switches such as MOSFETs, JFETs, transistors, or diode bridges can be used instead of relays, and the unselected range resistor sections will interfere with the measurements only to the extent of the residual current of a zero-biased diode which is within picoampere level or less. That is, such solid state switches can be used because there is residual current cancellation using a guard diode technique. As contrasted with relays to prevent interference with the measuring across the selected range resistor, solid state switches have many advantages. For example, they are cheaper, easily integrated, have better performance, are faster, and more reliable. The diode pair could also be implemented as part of a diode bridge that functions as the switch.

The invention can also be practiced by a circuit adapted for testing an electronic device in two alternate modes of operation wherein, in a first mode, a predetermined voltage is forced to the device and current drawn by the device is measured, and, in the alternate second mode, a predetermined current is forced to the device and voltage applied to the device is measured. In such arrangement, the circuit comprises a terminal adapted for connecting to the device, an input voltage source, and a plurality of range resistor sections each comprising a switch, a diode pair and a corresponding range resistor coupled in series between the input voltage source and the terminal. The circuit also includes means for disabling all the range resistor sections except a selected one wherein the disabling means comprises means for opening the switch and zero biasing the diode pairs of all unselected range resistor sections. Means operable in the first mode is provided for producing a predetermined voltage at the terminal through the range resistor of the selected range resistor section. Also, the circuit comprises a difference amplifier having inputs responsive to a voltage drop across the range resistor of the selected section for producing an output voltage proportional to current drawn through the resistor by the device in the first mode. Also included is means operable in the second mode of operation and responsive to the output of the difference amplifier for forcing a predetermined current through the selected range resistor section into the device and providing a voltage proportional to the voltage at the terminal during the second mode of operation.

In a circuit comprising a plurality of range resistor sections coupled between an input voltage source and a terminal adapted to be connected to a device under test wherein each section comprises a switch, a pair of diodes connected in parallel with opposite polarity and a range resistor, the invention includes a method of selecting one range resistor to supply current through the terminal to the device under test without interference or addition of current through the unselected range resistors comprising the steps of closing the switch corresponding to the selected range resistor, opening the switches corresponding to unselected range resistors, and zero biasing pairs of diodes corresponding to unselected range resistors.

BRIEF DESCRIPTION OF THE DRAWINGS

The foregoing objects and advantages will be more fully understood by reading the following Description of the Preferred Embodiment with reference to the drawings wherein.

DESCRIPTION OF THE PREFERRED EMBODIMENT

Figure 2:
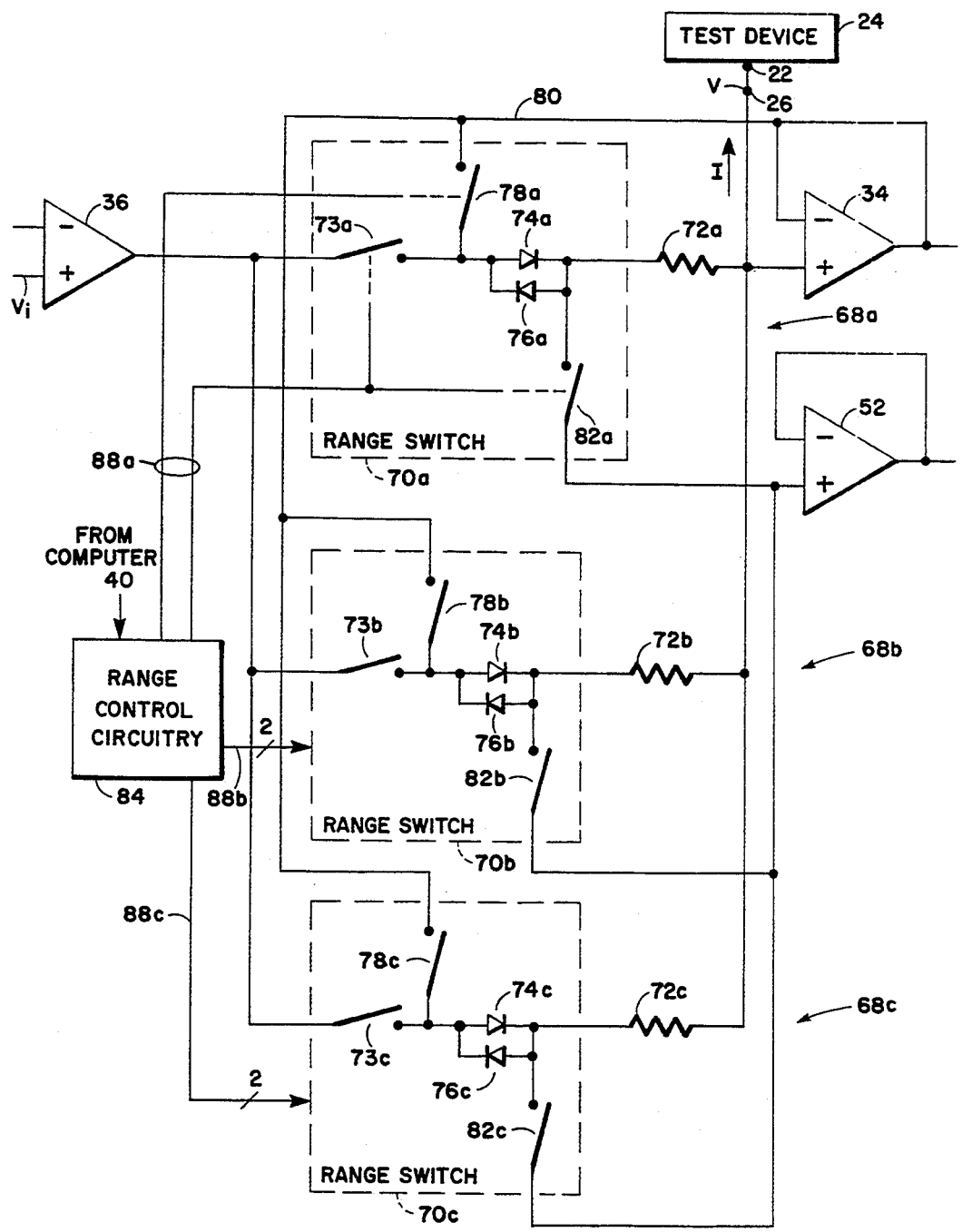
FIG. 2 is a simplified schematic of a plurality of range resistor sections connected in parallel between the operational amplifier and buffer amplifiers of FIG. 1.
Figure 3:
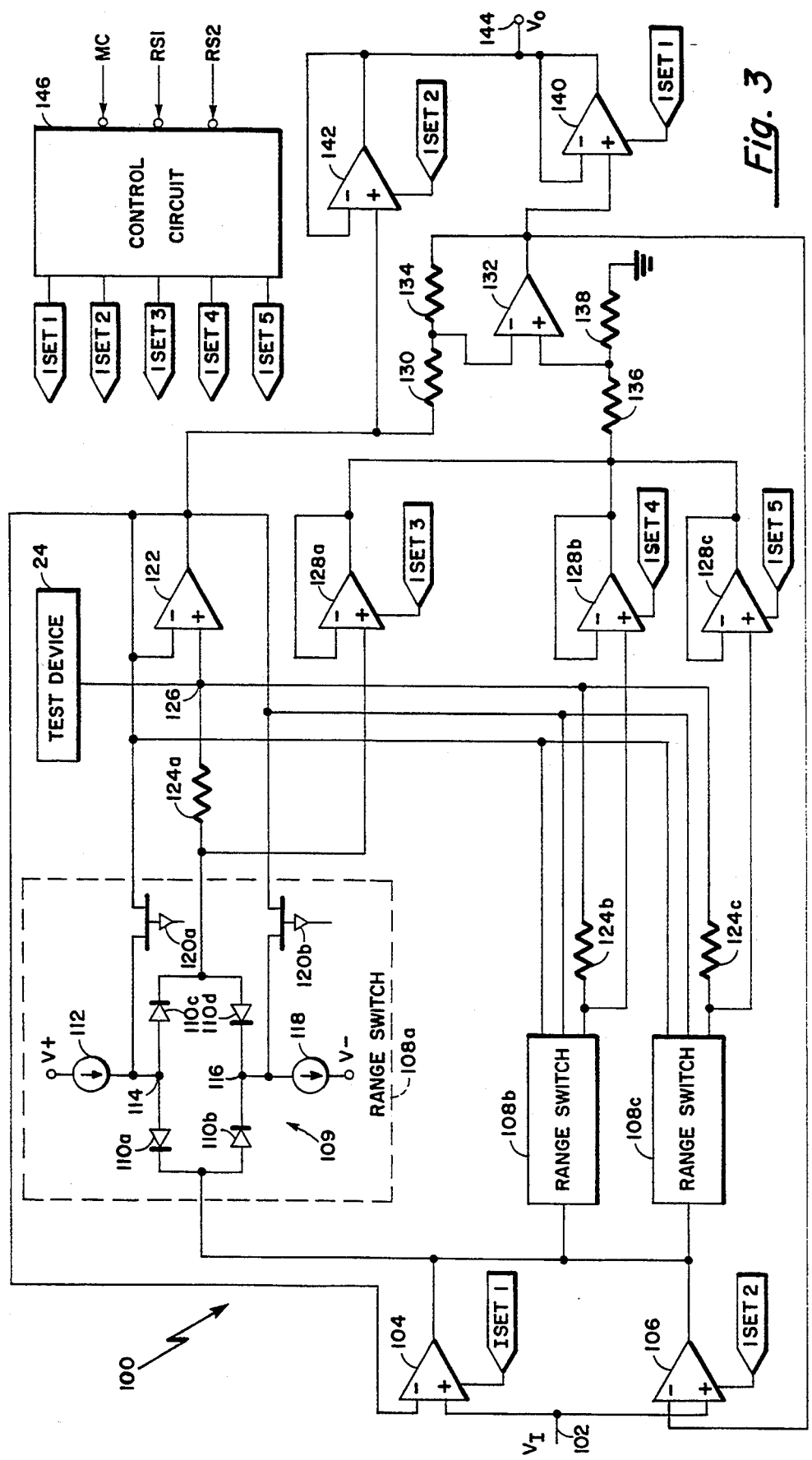
FIG. 3 is a simplified schematic of an integrated circuit implementation of the parametric test circuit of FIGS. 1 and 2.

Referring generally to the drawings, a circuit 20 includes a terminal 26 adapted to be connected to a device under test 24. An input voltage source such as line 32 is provided to supply an input voltage $V_I$ from DAC 38. As shown in FIG. 2, a plurality of range resistor sections 68a-c are coupled in parallel between the input voltage source on line 32 and the terminal 26 coupled to the test device 24. Each section 68a-c has a corresponding switch 73a-c and a diode here shown as an antiparallel diode pair 74a-c and 76a-c. Range selector means 84 closes the switch 73a corresponding to a selected range resistor such as resistor 72a, and opens the switches 73b and c while zero biasing the diode pairs 74b and c and 76b and c corresponding to unselected range resistors such as resistors 72b and c. In an integrated circuit implementation as shown in FIG. 3, the range switches 108a-c in combination with respective range resistors 124a-c make up the range resistor sections. Also, the diode pair 110c and d is part of a diode bridge 109 that implements the function of switch 73a of FIG. 2. In such manner, the diode pairs of unselected range resistors are zero biased and the residual current through the unselected range resistors is canceled. Thus, the current flowing through unselected range resistors is so small that it does not interfere with the accuracy of determining the current flowing to the test device by measuring the current flowing through the selected range resistor.

Figure 1:
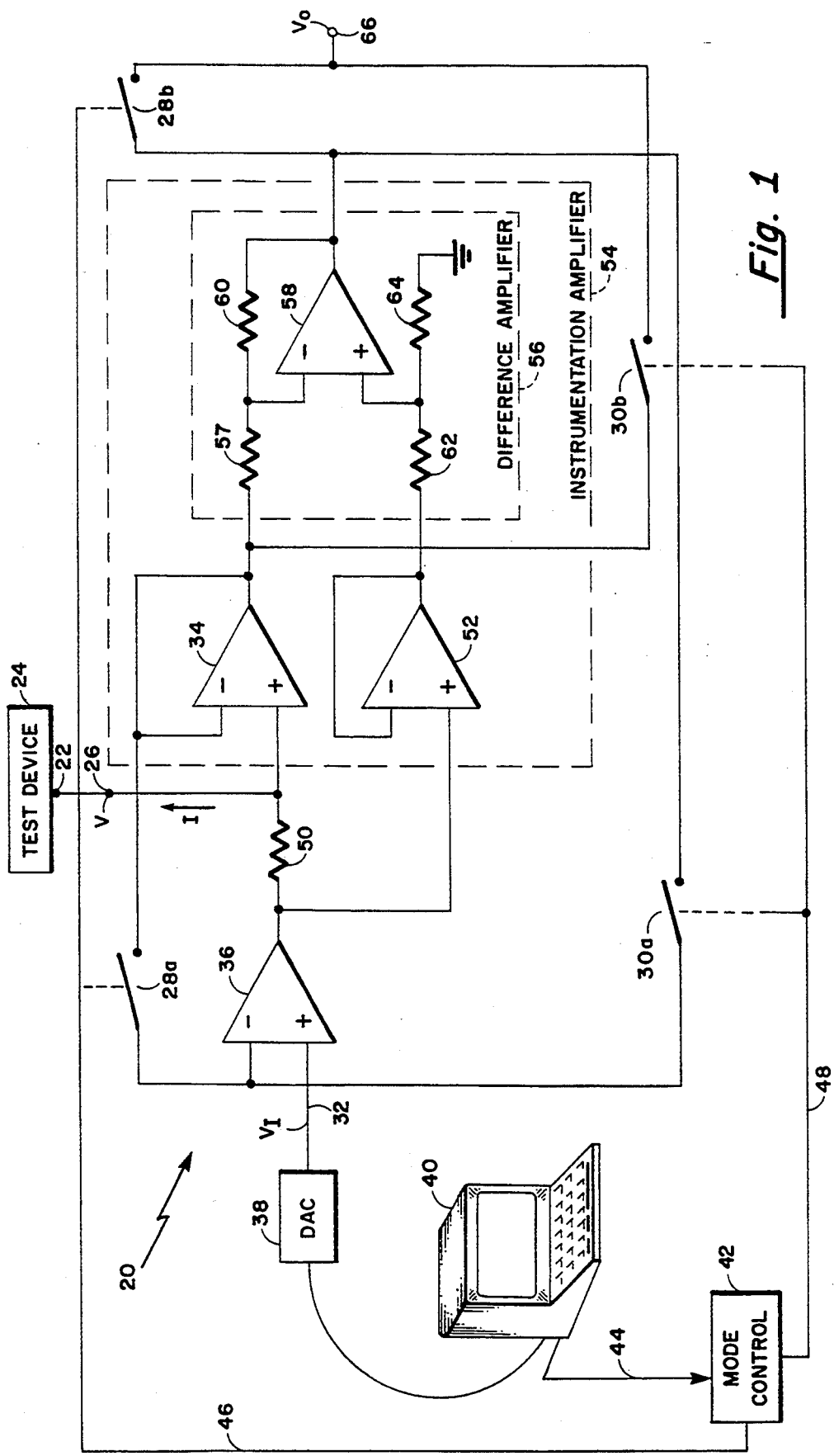
FIG. 1 is a simplified schematic of a parametric test circuit connected to a test device.

Now, referring specifically to FIG. 1, a parametric test circuit 20 is adapted for alternately providing two different functions or modes for making parametric measurements on a device under test here referred to as test device 24. That is, in one mode or function, circuit 20 forces a predetermined voltage V on terminal 26 which is connected to pin 22 of test device 24, and measures the current I drawn by the test device 24. In the alternate mode or function, circuit 20 forces a predetermined current I into the test device 24, and measures the voltage V. These two alternate modes are descriptively referred to as force voltage/measure current and force current/measure voltage.

In the force voltage/measure current mode of operation, switches 28a and b are closed, and switches 30a and b are open. In this configuration, the voltage V, which is applied to pin 22 of test device 24 is equal to the input voltage $V_I$ that is supplied to the circuit 20 on line 32. In particular, buffer amplifier 34 has negative feedback and is connected in a voltage follower configuration. Thus, voltage V, which is applied to its noninverting or positive input is present at its output, and is fed through closed switch 28a to the negative input of amplifier 36. Amplifier 36 functions as an operational amplifier, so the input voltages V and $V_I$ tend to equalize.

The input voltage $V_I$ is fed to amplifier 36 from a suitable source, and is here shown to be fed from a digital to analog converter or DAC 38 that is fed by an operator selectable device such as computer 40. Thus, in the typical operating environment, an operator uses computer 40 to introduce to DAC 38 a digital value corresponding to the desired test voltage $V_I$. DAC 38 converts the digital value to an analog voltage $V_I$ that is applied to the positive input of amplifier 36. Also under operator or software control, computer 40 feeds a control signal to mode control 42 on line 44. In response thereto, mode control 42 determines the state of switches 28a and b and 30a and b. That is, if the mode is force voltage/measure current, mode control 42 uses control line 46 to close switches 28a and b, and control line 48 to open switches 30a and b. Conversely, if the mode is force current/measure voltage, mode control 42 uses control line 46 to open switches 28a and b, and uses control line 48 to close switches 30a and b.

The output of amplifier 36 is connected through resister 50 to terminal 26 which is in turn connected to pin 22 of test device 24 and also to the positive input of buffer amplifier 34. The output of amplifier 36 is also connected to the positive input of buffer amplifier 52. Like buffer amplifier 34, buffer amplifier 52 is configured as a voltage follower. Since both amplifiers 34 and 52 have unity gain and have respective positive inputs connected across resistor 50, the difference between their respective outputs is the voltage drop across resistor 50 which is $I \times R$, where I is the current flowing into test device 24 and R is the resistance of precision resistor 50. As shown, buffer amplifiers 34 and 52 are part of instrumentation amplifier 54 which also includes difference amplifier 56. The output of buffer amplifier 34 is connected to one input of difference amplifier 56, and is fed through resistor 57 to the negative input of amplifier 58. Feedback is provided to the negative input of amplifier 58 through resistor 60. The output of buffer amplifier 52 is connected to the other input of difference amplifier 56, and is fed to ground through series resistors 62 and 64 with the junction between being connected to the positive input of amplifier 58. Resistors 57, 60, 62, and 64 are here selected to provide difference amplifier 56 with a gain G equal to resistor 60 divided by resistor 57 which is equal to resistor 64 divided by resistor 62. As an example, difference amplifier may have a gain G of 4 to improve the resolution of the measuring.

As described earlier, the difference between the respective outputs of buffer amplifiers 34 and 52 is $I \times R$, so the output of difference amplifier 56 is $G(I \times R)$. With switch 28b being closed as described in this force voltage/measure current mode, the output voltage Vo on output terminal 66 is proportional to the current I drawn by the test device 24. In short, by knowing the values for gain G and resistor 50, and measuring $V_o$, the current I for a forced voltage V can readily be determined in accordance with well known practice.

In the force current/measure voltage mode, switches 28a and b are open, and switches 30a and b are closed. In such configuration, the output of instrumentation amplifier 54 is fed back through switch 30a to the negative input of amplifier 36, and the output of buffer amplifier 34 is fed through switch 30b to output terminal 66 as $V_o$. In this configuration, the current I which is forced through resistor 50 to test device 24 is set according to the feedback from instrumentation amplifier 54, and is equal to $V_I$ divided by RxG. As shown, the voltage $V_o$ at output terminal 66 is the voltage V on terminal 26 because voltage V is coupled to the output of buffer amplifier 34 which is connected through closed switch 30b to output terminal 66. Thus, depending on the state of pairs of switches 28a and b and 30a and b as controlled by mode control 42, the circuit either forces voltage and measures current, or forces current and measures voltage.

It is noted that the same instrumentation amplifier 54 and precision resistor 50 are used in both modes of operation. This provides important advantages. First, it is apparent that only one set of components is required, so there is a cost savings over a configuration that uses separate or discrete components for each mode. Second, the performance is measured in both modes using the same key components, so there is no need to match components to obtain an accurate comparison or correlation between the two modes. Further, in prior art practice, software subroutines were typically run to calibrate and make offsets in the test unit before running each mode. Here, because the same key components are used in both modes of operation, only one calibration may be necessary for both modes of operation. This provides a time savings over a system with discrete boards that has to be calibrated for each mode. Further, measurement data taken in one mode may be more accurately correlated or combined in computation with data taken in the other mode because they are both taken with the same components under the same conditions such as temperature.

Referring to FIG. 2, an alternate embodiment of a portion of FIG. 1 is shown. In particular, resistor 50 of FIG. 1 is replaced by range resistor switching sections 68a–c each of which includes a respective range switch 70a–c and a corresponding range resistor 72a–c. Range resistor sections 68a–c are connected in parallel with the same connections as resistor 50 of FIG. 1. That is, each has one side connected to the output of operational amplifier 36, and the opposite side connected to output terminal 26 and the positive input of buffer amplifier 34.

The three range switches 70a–c are configured the same, and are connected to the rest of the circuit the same, so only range switch 70a will be described. The output of amplifier 36 is connected through forcing switch 73a to a pair of diodes 74a and 76a that are connected in parallel with opposite polarities, which is commonly referred to as an anti-parallel diode pair. That is, forcing switch 73a is connected to the anode of diode 74a, and to the cathode of diode 76a. Cancellation switch 78a has one terminal connected to line 80 coupled to the output of buffer amplifier 34, and the other terminal is connected to a junction or node between forcing switch 73a and the pair of diodes 74a and 76a. The opposite side of diode pair 74a and 76a is connected through range resistor 72a to the positive input of buffer amplifier 34, and also through sensing switch 82a to the positive input of buffer amplifier 52.

In operation, only one range switch section 68a–c is active at a time as controlled by range control circuitry 84. More specifically, the operator typically makes a determination as to which resistor 72a–c is to be switched into circuit 20 to obtain maximum voltage, and thus highest accuracy and resolution for the selected test current. The operator then provides an input command to computer 40 which produces a control signal to range control circuitry 84. Range control circuitry 84 functions to select only one range resistor 72a–c at a time to be actively coupled to terminal 26. More specifically, range control circuitry 84 is connected to each range switch 70a–c by a pair of lines 88a–c. One line of each pair 88a–c is used to control a respective cancellation switch 78a–c, and the other line is used to control a respective forcing switch 73a–c and sensing switch 82a–c. When a range switch 70a,b or c is active, the corresponding cancellation switch 78a,b or c is open and the corresponding forcing switch 73a,b or c and sensing switch 82a,b or c are closed. For example, if range resistor 72a is selected, range resistor section 68a is made active by range control circuitry 84 opening cancellation switch 78a, and closing forcing switch 73a and sensing switch 82a. Concurrently, range control circuitry 84 opens forcing switches 73b and c and sensing switches 82b and c, while closing cancellation switches 78b and c. Under this active or selected condition of range resistor section 68a, the output of amplifier 36 is coupled through forcing switch 73a, diode 74a and resistor 72a to terminal 26 and test device 24. This operation is analogous to the operation described with reference to FIG. 1. Further, the opposite side of resistor 72a is connected through sensing switch 82a to the positive input of buffer amplifier 52. Thus, instrumentation amplifier 54 senses the voltage drop across range resistor 72a which is here the selected range resistor.

If one of the other range resistors 72b or c is selected, range switch 70a disables the path through range resistor 72a, and also the other unselected range resistor 72b or c is disabled by the corresponding range switch 70b or c. Although three range resistor sections 68a–c are shown here, it is understood that a different number could be used. When range switch 70a is disabled, cancellation switch 78a is closed and forcing switch 73a and sensing switch 82a are opened. In such configuration, the output of buffer amplifier 34 is connected through closed cancellation switch 78a, diode pair 74a and 76a, and range resistor 72a to the positive input of buffer amplifier 34. No current will flow through this path, so the pair of diodes 74a and 76a are zero-biased. Stated differently, the voltage at the output of buffer amplifier 34 which is connected to one side of diode pair 74a and 76a is the same as the voltage on the positive input of buffer amplifier 34 which is connected through resistor 72a to the opposite side of diode pair 74a and 76a. Thus, there is no bias or voltage across the diode pair 74a and 76a. Thus, when a range switch 70a,b or c, is active, the other range switch sections 68a,b, or c will interfere only by the residual current of a zero-biased diode which is typically less than a picoampere. More particularly, forcing switches 73a–c may typically be implemented using a MOSFET, JFET, transistor, diode bridge or comparable device. With such a component and without cancellation switches 78a–c, the residual current through such component could be large enough during a disabled state to interfere with the accuracy of determining current I by measuring the voltage drop across the selected range resistor 72a,b or c.

In summary, cancellation switches 78a-c provide a guard diode technique to zero-bias diode pair 74a-c and 76a-c to permit the use of solid state switches such as MOSFETs, JFETs, transistors or diode bridges in lieu of relays. Solid state switches have a number of advantages. For example, they are generally cheaper, easily integrated, have better performance, are faster, and more reliable. The zero-biased diodes prevent interference of residual current through nonselected force switches 73a-c. Thus, accurate measurements are attainable with an integrated circuit implementation for circuit 20.

Referring to FIG. 3, a simplified schematic shows circuit 100 that functions in an analogous manner to circuit 20 of FIGS. 1 and 2. In particular, circuit 100 shows a mode switching and range resistor switching implementation that has advantage in integrated circuit implementation. An input reference voltage $V_I$ is applied on line 102 that is analogous to line 32 of FIG. 1. Line 102 is coupled to the positive or noninverting inputs of operational amplifiers 104 and 106. The outputs of operational amplifiers 104 and 106 are connected in common, and fed in parallel to range switches 108a-c that correspond to range switches 70a-c in FIG. 2. Range switches 108a-c are identical, so only range switch 108a will be described. The input to range switch 108a is connected to diode bridge 109 including diodes 110a-d connected in the manner shown. Voltage V+ is connected through current source 112 to high impedance node 114, and high impedance node 116 is connected through current source 118 to voltage V−. Nodes 114 and 116 are also coupled through respective JFETs 120a and b to the output of buffer amplifier 122 that corresponds to buffer amplifier 34 in FIGS. 1 and 2. The output of range switch 108a is coupled through range resistor 124a and terminal 126 to the positive input of buffer amplifier 122, and is also coupled to the positive input of buffer amplifier 128a. In integrated circuit implementation, it may be preferable that range resistors 124a-c be connected externally, in which case suitable terminals would be provided. Test device 24 is connected to terminal 126.

In similar manner, the outputs of range switches 108b and c are connected through range resistors 124b and c to terminal 126, and also are coupled to the positive inputs of buffer amplifiers 128b and c, respectively. Range switches 108b and c also have similar connections to the output of buffer amplifier 122.

The output of buffer amplifier 122 is fed back and connected to the negative input of operational amplifier 104. The output of buffer amplifier 122 is also connected through resistor 130 to the negative input of difference amplifier 132 which is analogous to amplifier 58 of difference amplifier 56 of FIG. 1. Difference amplifier 132 has feedback through resistor 134 to its negative input. The output of buffer amplifiers 128a-c are connected in common and fed through resistor 136 to the positive input of difference amplifier 132. Resistor 138 is connected between the positive input of difference amplifier 132 and ground. The output of difference amplifier 132 is connected to the positive input of amplifier 140 that is connected as a voltage follower, and also is fed back to the negative input of operational amplifier 106. As shown, the output of buffer amplifier 122 is also connected to the positive input of amplifier 142 that is connected as a voltage follower. The outputs of amplifiers 140 and 142 are connected in common and fed to output terminal 144 to provide the output voltage $V_o$.

In operation, off-chip control signals MC, RS1 and RS2 are selectively input to control circuit 146. Mode control MC signal is a "1" or "0" which determines whether circuit 100 is operated in the force voltage/measure current mode or the force current/measure voltage mode. In response thereto, control circuit 146 provides control voltages ISET 1 to amplifiers 104 and 140, and ISET 2 to amplifiers 106 and 142. In conventional manner, ISET 1 and 2 control the internal bias currents for respective amplifiers 104, 106, 140, and 142. Therefore, if an ISET control signal is zero voltage, the corresponding amplifier is turned off. Conversely, if an ISET control voltage is a suitable operating voltage, the corresponding amplifier is turned on. Amplifiers 104 and 140 are both controlled by ISET 1 and amplifiers 106 and 142 are both controlled by ISET 2. When mode control MC is set for the force voltage/measure current mode, control circuit 146 sets ISET 2 to zero; and when mode control MC is set for the force current/measure voltage mode, control circuit 146 sets ISET 1 to zero. Thus, in the force voltage/measure current mode, amplifier 104 and 140 are turned on while amplifiers 106 and 142 are turned off. Also, in the force current/measure voltage mode, amplifiers 106 and 142 are turned on while amplifiers 104 and 140 are turned off. In other words, amplifiers 104 and 106 operate as a complementary pair with only one being turned on at a time depending on the selected mode. Amplifiers 140 and 142 also operate as a complementary pair with only one being turned on at a time. If amplifiers 104 and 140 are on, then the output of buffer amplifier 122 is fed back to the negative input of amplifier 104 analogous to switch 28a of FIG. 1 being closed. Also, analogous to the operation of circuit 20 of FIG. 1, the output of difference amplifier 132 is fed with unity gain through amplifier 140 to voltage output terminal 144. If amplifiers 106 and 142 are on, then the output of difference amplifier 132 is fed back to the negative input of amplifier 106 and the output of buffer amplifier 122 is fed with unity gain through amplifier 142 to voltage output terminal 144. This also is analogous to the operation of circuit 20 of FIG. 1 in the force current/measure voltage mode of operation. Thus, by using ISET 1 and 2 to selectively turn off one of the complementary pair of amplifiers 104 or 106 at the input of circuit 20 and correspondingly turning off one of the complementary pair of amplifiers 140 or 142 at the output, the function of switches 28a and b and 30a and b of FIG. 1 is implemented in circuit 100 that is readily adapted to an integrated circuit.

Still referring to FIG. 3, resistor range select signals RS1 and RS2 determine which range resistor 124a,b or c is activated into circuit 100. In particular, RS1 and RS2 are off-chip binary control signals that determine which one of ISET 3-5 is set to a suitable operating voltage by control circuit 146; all the other ISET signals are set to zero to disable or turn off all but one range switch 108a-c. Although the interconnections are not shown, control circuit 146 also controls the bias and hence the operation of current sources 112 and 118 and JFETS 120a and b in a manner to be described. Assuming first that range resistor 124a is to become active while all the other range resistors are inactive, ISET 3 is set to a suitable operating voltage while ISET 4 and 5 are set to zero. Thus, buffer amplifier 128a is turned on and buffer amplifiers 128b and c are turned off. In this state, control circuit 146 also activates or turns on current sources 112 and 118 thereby activating current flow through diode bridge 109 which operates as a switch in conventional manner to implement the function of switch 73a of FIG. 2. More particularly, when current sources 112 and 118 are disabled, diode bridge 109 functions as an open switch. However, when current flows from current source 112 through parallel branches including diodes 110a and b and diodes 110c and d, the voltage drops from input to output across diodes 110a and c cancel each other, as do the voltage drops across diodes 110b and d. Thus, with current flowing down through diode bridge 109, it functions as a closed switch with the output voltage to range resistor 124a being equal to the input voltage from operational amplifier 104 or 106. Thus, depending on the operating mode, the output of either operational amplifier 104 or 106 is coupled through range resistor 124a to terminal 126. With buffer amplifier 128a turned on, it functions analogous to buffer amplifier 52 of FIG. 2, and the outputs of buffer amplifier 122 and 128a represent the voltage drop across selected range resistor 124a.

When one of the other range resistors 124b or c is active, control circuit 146 sets ISET 3 to zero to turn off buffer amplifier 128a, and also control circuit 146 turns off current sources 112 and 118 to open the switch implemented by diode bridge 109. Thus, only residual currents would normally flow through range resistor 124a and the other disabled range resistor 124b or c. Therefore, the voltage potentials at the output of diode bridge 109 would be almost the same as terminal 126 which is coupled to test device 24. Further, control circuit 146 turns on JFETs 120a and b, that function as switches analogous to switch 78a of FIG. 2. Therefore, the high impedance nodes 114 and 116 are biased to virtually the same voltage potential as the output of buffer amplifier 122. In the same manner as described with reference to FIG. 2, the feedback from buffer amplifier 122 through JFET switches 120a and b sets a zero bias for diodes 110c and d which are analogous to the antiparallel diode pair 74a and 76a of FIG. 2. Thus, any residual current through range resistor 124a is canceled out. The other disabled range switch 108b or c, and any other disabled switches if additional range resistors are used, operate in a similar manner. As a result, the current flowing through the solitary active range resistor 124a,b or c is, with great accuracy, equal to the current flowing to test device 24. Further, ISET 3 turns off buffer amplifier 128a in this disabled state of range resistor 124a, so only the buffer amplifier 128b or c of the selected range resistor 124b or c will be actively coupled to difference amplifier 132

This completes the description of the preferred embodiment. However, for one skilled in the art, a reading of it will bring to mind many alterations and modifications that do not depart from the spirit and scope of the invention. Accordingly, it is intended that the scope of the invention be limited only by the appended claims.

What is claimed is:

1. A circuit comprising:
    a terminal adapted to be connected to a device under parametric test;
    an input voltage source;
    a plurality of range resistor sections coupled in parallel between said input voltage source and said terminal, each of said sections comprising a range resistor and a corresponding switch and first diode connected in series; and
    range resistor selector means for closing the switch corresponding to a selected range resistor and opening the switches and zero biasing means for biasing the diodes corresponding to unselected range resistors.

2. The circuit recited in claim 1 wherein each of said range resistor sections further comprises a second diode connected in parallel with opposite polarity to said first diode.

3. The circuit recited in claim 1 further comprising means comprising a difference amplifier having inputs responsive to a current drop across the selected range resistor for providing a voltage proportional to current drawn through the selected range resistor by said device.

4. The circuit recited in claim 3 wherein said voltage providing means further comprises a pair of buffer amplifiers having respective positive inputs coupled to opposite sides of the selected range resistor, said difference amplifier being responsive to outputs of said buffer amplifiers.

5. The circuit recited in claim 4 wherein said pair of buffer amplifiers are connected as voltage followers.

6. The circuit recited in claim 5 wherein said zero biasing means comprises means for coupling an output of a predetermined one of said buffer amplifiers to a side of said first and second diodes opposite corresponding unselected range resistors.

7. A circuit comprising:
    a terminal adapted for connection to a device to be parametrically tested;
    an input voltage source;
    a plurality of range resistor sections coupled in parallel between said input voltage source and said terminal, each of said sections comprising a switch, an anti-parallel diode pair, and a range resistor of predetermined resistance coupled in series between said input voltage source and said terminal; and
    control means for producing a flow of current through a selected one of said range resistors through said terminal to said device while preventing interfering current flowing through the other unselected range resistors through said terminal to said device, said control means comprising means for closing the switch corresponding to the selected range resistor while opening the switches and zero biasing the diode pairs corresponding to the unselected range resistors.

8. The circuit recited in claim 7 further comprising means comprising a difference amplifier responsive to a voltage drop across the selected range resistor for producing a voltage proportional to current flowing through the selected range resistor to said device.

9. A circuit comprising:
    a terminal adapted for connecting to a device under test;
    first and second amplifiers each connected as a voltage follower, said terminal being connected to a positive input terminal of said first amplifier;
    an input voltage source;
    a plurality of range resistor sections connected in parallel between said voltage source and said terminal, each of said range resistor sections comprising a first switch, a pair of diodes connected in parallel with opposite polarity, and a range resistor connected in series, each of said range resistor sections further comprising a second switch connected from a positive input of said second amplifier to a side of said range resistor opposite said terminal;

control means for closing the first and second switches of a selected range resistor section while opening the first and second switches of all unselected range resistor sections; and means responsive to said control means for providing a zero-bias across the pair of diodes of all of said unselected range resistor sections.

10. The circuit recited in claim 11 wherein said zero biasing providing means comprises a third switch connected between the output of said first amplifier and a side of each of said pairs of diodes opposite the corresponding one of said range resistors.

11. A circuit adapted for testing an electronic device in two alternate modes of operation wherein, in a first mode, a predetermined voltage is forced to the device and current drawn by the device is measured, and, in the alternate second mode, a predetermined current is forced to the device and voltage applied to the device is measured, the circuit comprising:

a terminal adapted for connecting to said device;

an input voltage source;

a plurality of range resistor sections each comprising a switch, a diode pair and a corresponding range resistor coupled in series between said input voltage source and said terminal;

means for disabling all of said range resistor sections except a selected one, said disabling means comprising means for opening the switch and zero biasing the diode pairs of all unselected range resistor sections;

means operable in said first mode for producing a predetermined voltage at said terminal through the range resistor of the selected range resistor section;

means comprising a difference amplifier having inputs responsive to a voltage drop across the range resistor of said selected section for producing an output voltage proportional to current drawn through said resistor by said device in said first mode; and means operable in said second mode of operation and responsive to the output of said difference amplifier for forcing a predetermined current through the range resistor of the selected range resistor section into said device and for providing a voltage proportional to the voltage at said terminal during said second mode of operation.

12. The circuit recited in claim 11 wherein said current forcing means comprises an operational amplifier having a negative input coupled to an output of said difference amplifier in said second mode and a positive input coupled to said input voltage source, said operational amplifier having an output coupled to the range resistor of the selected range resistor section on the side opposite said terminal.

13. The circuit recited in claim 12 further comprising first and second buffer amplifiers connected as voltage followers with respective outputs being coupled to said difference amplifier, said first buffer amplifier having a positive input connected to said terminal and an output connected to a negative input of said operational amplifier in said first mode of operation, said second buffer amplifier having a positive input connected to said output of said operational amplifier.

14. The circuit recited in claim 13 wherein, in said first mode, said voltage applied to said device is equal to said predetermined input voltage and said output voltage is $G \times (R \times I)$ where G is the gain of said output voltage producing means, R is the resistance of the selected range resistor, and I is said current through the selected resistor.

15. The circuit recited in claim 13 wherein, in said second mode, said current through said selected range resistor is equal to $V_i/(R \times G)$ where $V_i$ is said predetermined input voltage, R is the resistance of said selected range resistor, and G is gain of said output voltage providing means.

* * * * *